April 5, 1960
A. HERLET ET AL
2,931,960
ELECTRIC SEMICONDUCTOR p-n JUNCTION DEVICES AND METHOD OF PRODUCING THEM
Filed Jan. 27, 1958
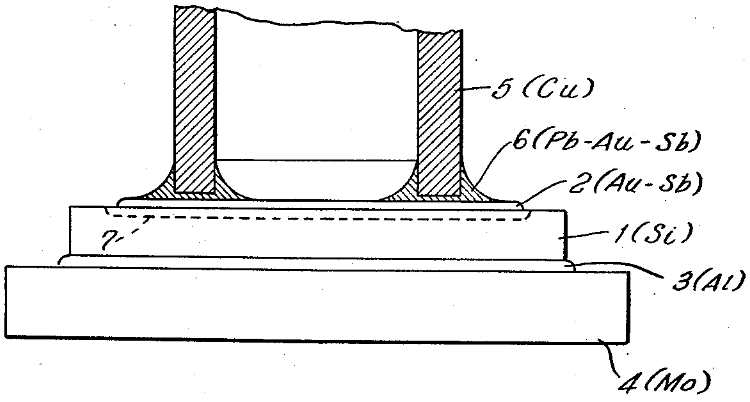

United States Patent Office 2,931,960
Patented Apr. 5, 1960

2,931,960

ELECTRIC SEMICONDUCTOR P-N JUNCTION DEVICES AND METHOD OF PRODUCING THEM

Adolf Herlet and Arnulf Hoffmann, Pretzfeld, Germany, assignors to Siemens-Schuckertwerke Aktiengesellschaft, Berlin, Siemensstadt, Germany, a corporation of Germany Application January 27, 1958, Serial No. 711,405

Claims priority, application Germany January 29, 1957

10 Claims. (Cl. 317—240)

Our invention relates to electric semiconductor p-n junction devices, which comprise a monocrystalline semiconductor body with one or more p-n junctions and is rated to withstand a normal operating temperature above 130° C., as is the case with silicon rectifiers and power transistors.

Such p-n junction devices particularly those containing a silicon monocrystal, are often joined with one or more gold electrodes which are fused onto, and alloyed together with the crystal to form an integral body therewith. Gold is preferred as electrode because it is suitable as a carrier for doping substances to be alloyed or diffused into the electrode-adjacent zones of the n-type or p-type crystal body in which such doping substance, acting as acceptor or donor, causes the occurrence of the desired p-n junction. The electric terminal pieces or current supply leads of good conducting metal, such as copper, can be joined with the gold electrodes by soldering.

The metallic solder for this purpose is preferably so chosen that the solder junction, on the one hand, does not melt at the highest expectable operating temperature of the semiconductor device and that, on the other hand, the soldering can be performed at a temperature in which the rectifier or transistor device is not yet impaired and, particularly, is not subjected to the danger of melting locally. Local melting is particularly disagreeable if it occurs near the boundary between semiconductor material and metal electrode because then the p-n junction may be short-circuited by molten material. For example, when the semiconductor body consists of crystalline silicon, the solder being employed must be suitable for soldering at a temperature between 150° and 300° C. Particularly favorable is the temperature range between 170° and 250° C. The soldering materials most commonly used in these ranges of soldering temperature and heretofore employed for the production of the above-described semiconductor devices are alloys of tin.

In the practical use of silicon rectifiers rated for very high current densities up to several 100 amps. per $cm.^2$ and operating at accordingly high normal temperatures above 130°, paritcularly 150° or more, it has been found that the devices become gradually impaired and, after extended periods of operation, many show permanent short-circuiting of their electrodes.

We discovered that these detrimental phenomena are due to changes in the solder junctions although such changes can neither be ascertained optically from the outside nor subsequently eliminated, for example, by etching. We further discovered that such changes are due to the tin content of the solder material, and that the presence of tin, under the above-mentioned exacting operating conditions of the semiconductor device, causes a considerable migration of material to occur in the gold electrode and beyond the crystal-gold boundary zone with the effect of bridging the p-n junction up to the counter electrode. The accuracy of these discoveries was confirmed by the fact that the above-mentioned defects did not occur when using a tin-free solder.

According to a feature of our invention, therefore, an electric semiconductor device with a monocrystalline semiconductor body, particularly of silicon, capable of withstanding a normal operating temperature of more than 130° C. and having at least one p-n junction and a predominantly gold-containing electrode, is produced by soldering the electrically conducting terminal or current-supply conductor to the gold electrode by means of solder consisting of a substantially tin-free alloy having a melting temperature of 150° or more.

The above-mentioned temperature limits for the soldering operation, of course, also apply to the use of tin-free solder on silicon semiconductor devices. That is, the soldering alloy must be so composed that the solder joint with the gold electrode does not soften at temperatures below 170° C. For that reason, low melting elemental metals, such as indium, are not suitable as soldering metal. Indium is advantageously used for semiconductor devices whose crystalline body consists of germanium. However, germanium crystals can be subjected to a normal operating temperature of at most 65 to 70° C., and a solder joint of indium produced on a germanium body melts at approximately 140° C. Because of this melting point, however, indium cannot be used as a solder for silicon and other semiconductor substances rated to operate at a normal temperature of more than 130° C.

The use of a tin-free solder with a melting temperature of 150° C. or more is applicable not only to silicon but also to a number of intermetallic compounds particularly semiconducting $A_{III}B_V$ compounds, for example gallium arsenide, gallium phosphide, aluminum arsenide, indium phosphide, and aluminum antimonide.

Particularly advantageous is a solder alloy which, like the electrodes, contains gold. This prevents depriving the usually very thin gold electrode of part of its gold content and also prevents the melting point of the solder from suffering uncontrollable changes during alloy formation. Suitable as solder for the purpose of the invention are alloys of gold with at least one of lead, bismuth and antimony. The eutectic or nearly eutectic alloys of this group are particularly favorable. For example, solders of gold-lead-bismuth are applicable; and particularly good results were obtained with a solder composition of about 75% lead, about 17% gold and about 8% antimony (all percentages mentioned herein being by weight). This composition appears to approach a ternary eutecticum and has a melting point of approximately 195° C. Similarly advantageous are other lead-gold-antimony alloys that somewhat depart from this composition but contain predominantly lead and a larger amount of gold than antimony; the approximate limits of the individual components being 73 to 77% for lead, 15 to 19% for gold and 6 to 10% for antimony. Although antimony as such acts as a donor in silicon, such antimony-containing solder are applicable not only on electrodes adjacent to an n-type zone of the silicon, but also on electrodes adjacent to a p-type zone. This is so because, due to the above-mentioned relatively low soldering temperature, there is no danger that the antimony content of the solder may cause doping and, as the case may be, a change in conductance type (from p-type to n-type) of the electrode-adjacent semiconductor material.

Also suitable for the purposes of the invention are bismuth-gold alloys with about 70 to about 90% bismuth, and 10 to 30% gold, and lead-gold alloys with about 70 to about 90% lead and 10 to 30% gold. Particularly favorable are the binary eutectic compositions of about 82% bismuth with gold as the remainder and about 85% lead with gold as the remainder. Generally applicable as solder according to the invention are alloys of gold with other, low-melting heavy metals, such as cadmium, having a melting temperature within the above-mentioned soldering range. In each case, however, the presence of tin must be avoided.

The drawing illustrates schematically an embodiment of a p-n junction rectifier according to the invention. The monocrystalline semiconductor body 1 consists of p-type silicon with which two electrodes 2, 3 are fused together in face to face area contact. The electrode 2 is made of gold-antimony foil composed of 95 to 99.8% gold and 5 to .2% antimony, as described in the copending application of H. Patalong, Serial No. 657,631, filed May 7, 1957. The electrode 3 consists of aluminum foil and is fusion-joined with a carrier plate 4 of molybdenum which also forms an electric terminal member of the rectifier. The particular manner of joining the components 1, 2, 3, 4 is not essential to the invention proper, but we prefer assembling these components and then heating them under slight pressure between graphite plates or embedded in graphite powder, the latter method being more fully described and claimed in the copending application of R. Emeis, Serial No. 637,029, filed January 29, 1957, and assigned to the assignee of the present invention.

Joined with the gold electrode 2 is a tubular conductor 5 of copper by means of a solder bond 6 consisting of the above-described alloy approximately composed of 75% lead, 17% gold and 8% antimony. The silicon body 1 comprises a p-n junction near the alloying zone adjacent to the gold electrode, this junction being schematically indicated by a broken line at 7. The rectifier unit can be operated at a rated normal temperature of 150° C. for any length of time without breakdown of its blocking ability due to the above-mentioned causes.

We claim:

1. An electric semiconductor device, comprising a monocrystalline semiconductor body including a p-n junction and having a rated normal temperature above 130° C., an electrode joined with said body and consisting predominantly of gold, an electric conductor member, and a solder junction joining said member to said electrode and consisting of a tin-free gold alloy having a melting point above 150° C. and below 300° C.

2. An electric semiconductor device, comprising a monocrystalline semiconductor body of silicon having a p-n junction, an electrode joined with said body and consisting predominantly of gold, an electric conductor member, and a solder junction joining said member to said electrode and consisting substantially of an alloy of gold with at least one substance selected from the group consisting of lead, bismuth, antimony and cadmium, said alloy having a melting point above 150° C. and below 300° C.

3. An electric semiconductor device, comprising a monocrystalline semiconductor body of silicon including a p-n junction and having a rated normal temperature above 130° C., an electrode joined with said body and consisting predominantly of gold, an electric conductor member, and a solder junction joining said member to said electrode and consisting of a substantially eutectic alloy of gold with at least one substance selected from the group consisting of lead, bismuth and antimony, said alloy having a melting point above 150° C. and below 300° C.

4. An electric semiconductor device, comprising a crystalline semiconductor body of silicon including a p-n junction and having a rated normal temperature above 130° C., an electrode joined with said body and consisting predominantly of gold, an electric conductor member, and a solder junction joining said member to said electrode and consisting of a lead-gold-antimony alloy containing about 75% lead, about 17% gold, the remainder being substantially all antimony.

5. An electric semiconductor device, comprising a monocrystalline semiconductor silicon body including a p-n junction and having a rated normal temperature above 130° C., an electrode joined with said body and consisting predominantly of gold, an electric conductor member, and a solder junction joining said member to said electrode and consisting of a tin-free gold alloy having a melting point above 150° C. and below 300° C.

6. An electric semiconductor device, comprising a monocrystalline semiconductor silicon body including a p-n junction and having a rated normal temperature above 130° C., an electrode joined with said body and consisting predominantly of gold, an electric conductor member, and a solder junction joining said member to said electrode and consisting of a tin-free gold alloy having a melting point above 150° C. and below 300° C., said gold alloy being a binary bismuth-gold alloy composed of about 70 to about 90% bismuth, and about 10 to 30% gold.

7. An electric semiconductor device, comprising a monocrystalline semiconductor silicon body including a p-n junction and having a rated normal temperature above 130° C., an electrode joined with said body and consisting predominantly of gold, an electric conductor member, and a solder junction joining said member to said electrode and consisting of a tin-free gold alloy having a melting point above 150° C. and below 300° C., said gold alloy being a binary lead-gold alloy composed of about 70 to 90% lead, and about 10 to 30% gold.

8. An electric semiconductor device, comprising a monocrystalline semiconductor body including a p-n junction and having a rated normal temperature above 130° C., an electrode joined with said body and consisting predominantly of gold, an electric conductor member, and a solder junction joining said member to said electrode and consisting of a tin-free alloy of gold and low-melting heavy metal, said alloy having a melting point above 150° C. and below 300° C.

9. An electric semiconductor device, comprising a crystalline semiconductor body of silicon including a p-n junction and having a rated normal temperature above 130° C., an electrode joined with said body and consisting predominantly of gold, an electric conductor member, and a solder junction joining said member to said electrode and consisting of a lead-gold-antimony alloy having a melting point between 170 and 250° C., said alloy containing 15 to 19% gold and 6 to 10% antimony, the remainder being substantially all lead.

10. An electric semiconductor device, comprising a monocrystalline $A_{III}B_V$ compound semiconductor body including a p-n junction and having a rated normal temperature above 140° C., an electrode joined with said body and consisting predominantly of gold, an electric conductor member, and a solder junction joining said member to said electrode and consisting of a tin-free gold alloy having a melting point above 150° C. and below 300° C.

References Cited in the file of this patent

UNITED STATES PATENTS

| | | |
|---|---|---|
| 2,763,822 | Frola et al. | Sept. 18, 1956 |
| 2,793,420 | Johnston et al. | May 28, 1957 |
| 2,811,682 | Pearson | Oct. 29, 1957 |
| 2,825,667 | Mueller | Mar. 4, 1958 |
| 2,854,612 | Zaratkiewicz | Sept. 30, 1958 |